United States Patent
Chen et al.

(10) Patent No.: US 7,601,563 B2
(45) Date of Patent: Oct. 13, 2009

(54) SMALL FORM FACTOR MOLDED MEMORY CARD AND A METHOD THEREOF

(75) Inventors: Ben Wei Chen, Fremont, CA (US); Jin S. Wang, Torrance, CA (US); David Hong-Dien Chen, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 293 days.

(21) Appl. No.: 11/624,615

(22) Filed: Jan. 18, 2007

(65) Prior Publication Data

US 2007/0117276 A1 May 24, 2007

Related U.S. Application Data

(63) Continuation of application No. 11/148,999, filed on Jun. 10, 2005, now Pat. No. 7,378,301.

(51) Int. Cl.
*H01L 21/50* (2006.01)
*H01L 21/48* (2006.01)
*H01L 21/44* (2006.01)
*H01L 23/02* (2006.01)
*H01L 23/34* (2006.01)
*H01L 29/68* (2006.01)

(52) U.S. Cl. ............ 438/126; 438/127; 438/124; 438/106; 257/678; 257/679; 257/723; 257/724; 257/E29.17

(58) Field of Classification Search .......... 438/126, 438/127, 124, 106; 257/678, 679, 723, 724, 257/E29.17
See application file for complete search history.

(56) References Cited

U.S. PATENT DOCUMENTS

| | | | |
|---|---|---|---|
| 6,444,501 B1 * | 9/2002 | Bolken ................ | 438/127 |
| 6,624,005 B1 | 9/2003 | DiCaprio et al. | |
| 2004/0090829 A1 * | 5/2004 | Miura et al. ............ | 365/200 |
| 2006/0281229 A1 | 12/2006 | Koh et al. | |

* cited by examiner

*Primary Examiner*—Luan C Thai
(74) *Attorney, Agent, or Firm*—Sawyer Law Group, P.C.

(57) ABSTRACT

A shape-molding structure of a memory card comprises a circuit substrate, at least one chip, and an encapsulant covering. The upper and lower surfaces of the circuit substrate have a circuit layer and a plurality of electric contacts, respectively. The chip is located on the upper surface of the circuit substrate and electrically connected with the circuit layer. The encapsulant covering is formed by using a mold to press encapsulant entering at least one encapsulant inlet provided on at least one side surface of the circuit substrate. The encapsulant covering encapsulates all the above components with only the electric contacts exposed. A trace mark of the encapsulant inlet remaining on the encapsulant covering is then cut to obtain a shape-molding structure of memory card with an smooth and intact outer appearance.

23 Claims, 8 Drawing Sheets

SMALL FORM FACTOR MOLDED MEMORY CARD AND A METHOD THEREOF

CROSS REFERENCE TO RELATED PATENT APPLICATIONS

This application is a continuation of co-pending patent publication number US/2006/0281229, filed on Jun. 10, 2005, entitled, "Method for molding a small form factor digital memory card," and assigned to the assignee of the present application.

BACKGROUND OF THE INVENTION

1. Field of the Invention

The present invention relates to a method for molding a small form factor memory card and, more particularly, to a shape-molding structure of memory card having an smooth and intact outer appearance.

2. Description of Related Art

Memory cards are widely utilized in various electronic products such as digital cameras, mobile phones, personal digital assistants (PDAs), and so on. The size of memory cards has decreased steadily over time. For instance, at the present time, the length and width of some memory cards (e.g., microSD cards or MMC Micro cards) is smaller than 1 cm, and their thickness is smaller than 1 mm.

U.S. Pat. No. 6,624,005, entitled "Semiconductor memory cards and method of making same," discloses a method of making a memory card that can cut through the body and the printed circuit board sheet, or panel substrate, in a "cookie cutting" pattern, after the encapsulating molding process is carried out. The above-identified process functions most efficiently if the memory card itself is rectangular or if there are straight lines at the sides of memory card.

Typically, as the memory card has developed, it has evolved into a more complex shape, as in the case of miniSD and microSD memory cards. As a consequence of this more complex shape, the memory card poses great challenges in the manufacturing process after the encapsulating molding process has been carried out. First, the cookie cutting process as described in the above-identified patent no longer works in an efficient and satisfactory manner. Second, the chamfer that needs to be cut involves cutting not only a two-dimensional corner, but also involves the three-dimensional aspect of the height and thickness of the card, as is the case with microSD cards.

Several conventional approaches are available to address the cutting of the complex shape of the memory card. After the encapsulating molding process has been completed, as is shown in FIG. 1, the memory cards 30 on a substrate panel 52 are cut or singulated using a water-jet machine, a precision laser, or a grinder. As the shape cutting process requires three-dimensional consideration, the process is very time-consuming and not cost effective.

An improvement to address the complex shape cutting process is thus required in order to reduce the time and cost in manufacturing. To address this in a conventional approach, instead of utilizing the previously-described cookie cutting approach, a group of individual shape-molding is required to take care of the complex shape. The only parts of the memory card that need to be cut are those that have straight lines, but not those with a complex shape. A water-jet machine, a precision laser, or a grinder is no longer required to perform complex but single-task cutting onto the memory card. Instead, a standard router, singulator or punch, as can be found in a standard semiconductor back-end process, is sufficient to detach or remove the finished molded memory card from the panel substrate.

As shown in FIG. 1A, a conventional memory card structure includes a circuit substrate 10 having an upper surface and a lower surface. A circuit layer 12 and a plurality of electric contacts 14 are located on the upper surface and the lower surface of the circuit substrate 10, respectively. A memory chip 16, a control chip 18 and several electronic components 20 are located on the upper surface of the circuit substrate 10 and electrically connected with the circuit layer 12. An encapsulant covering 22 encapsulates the circuit substrate 10 and all the above components on the upper surface of the circuit substrate 10 with only the electric contacts 14 on the lower surface of the circuit substrate 10 exposed for electric connection with the outside.

The method of forming the encapsulant covering 22 conventionally utilized in the prior art is described below. First, the circuit substrate 10 is placed on a lower mold surface of a mold 24. The mold 24 has an encapsulant inlet 26 located above the circuit substrate 10. Encapsulant will be injected in the encapsulant inlet 26 above the circuit substrate 10 to encapsulate the circuit substrate 10, the memory chip 16, the control chip 18 and the electronic components 20. After the encapsulant hardens, the memory card is taken out from the mold. FIG. 1B shows a conventional molding process in progress with encapsulant inlet on top of the memory card 30 mold. FIG. 1C shows a finished product memory card 30. However, a trace mark 28 of the encapsulant inlet will remain on the surface of the finished product of memory card 30. Because the memory card 30 structure is so small, once there is any appearance flaw (e.g., the trace mark 28 of the encapsulant inlet 26 in FIG. 1C) remaining on the outer surface of the memory card 30 during the manufacturing process, this appearance flaw will be very obvious. Moreover, the size of future memory cards will tend to be even smaller, making any appearance flaw located on memory cards even more difficult to ignore.

Accordingly, the method and system in accordance with the present invention provides a molded structure of the memory card in order to solve the above drawback in the prior art.

SUMMARY OF THE INVENTION

One object of the present invention is to provide a shape-molding structure of a memory card, in which an encapsulant covering is formed by using a mold to press encapsulant entering at least one encapsulant inlet provided on at least one side surface of a circuit substrate, and a trace mark of the encapsulant inlet remaining on the outer surface of the encapsulant covering is then cut, thereby solving the problem of appearance flaws of conventional memory cards.

Another object of the present invention is to provide a shape-molding structure of a memory card, which makes use of a shaped mold pressing process to form an encapsulant covering of a memory card so as to simplify the processing procedure.

To achieve the above objects, the present invention proposes a shape-molding structure of a memory card, which comprises a circuit substrate, at least one chip, and an encapsulant covering. The upper and lower surfaces of the circuit substrate have a circuit layer and a plurality of electric contacts, respectively. The chip is located on the upper surface of the circuit substrate and electrically connected with the circuit layer. The encapsulant covering encapsulates all the above components with only the electric contacts exposed.

The encapsulant covering is formed by using a mold to press encapsulant entering at least one encapsulant inlet provided on at least one side surface of the circuit substrate. A trace mark of the encapsulant inlet remaining on the encapsulant covering is then cut.

DETAILED DESCRIPTION OF THE PREFERRED EMBODIMENTS

The present invention relates to a method for molding a small form factor memory card and, more particularly, to a shape-molding structure of memory card having an smooth and intact outer appearance. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
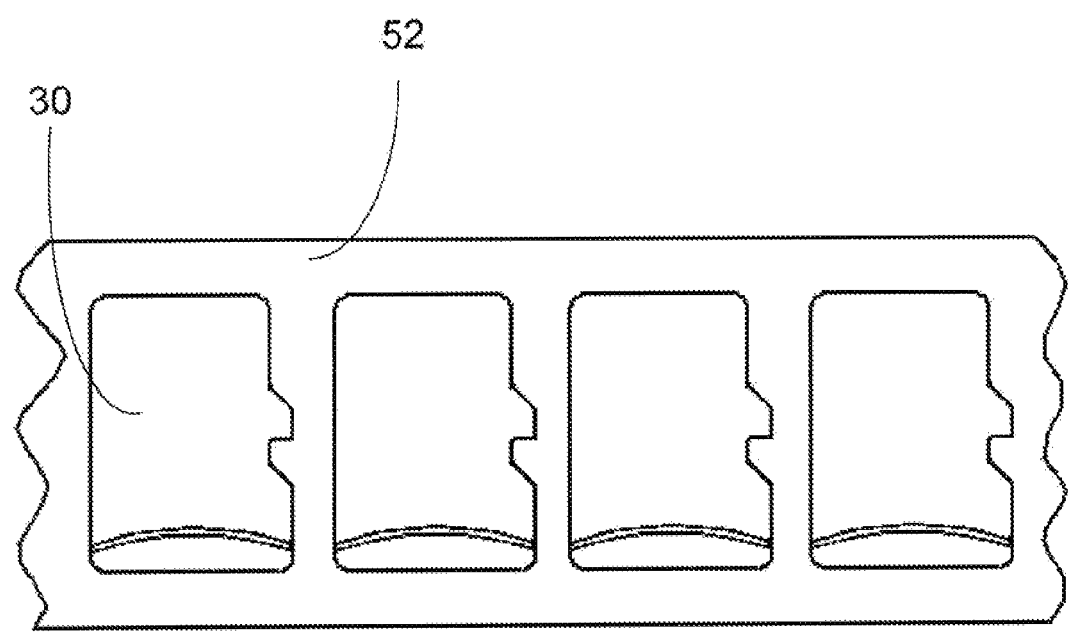
FIG. 1 is a top view of a prior art showing a substrate panel of a molded structure of memory cards with complex shape.
Figure 1A:
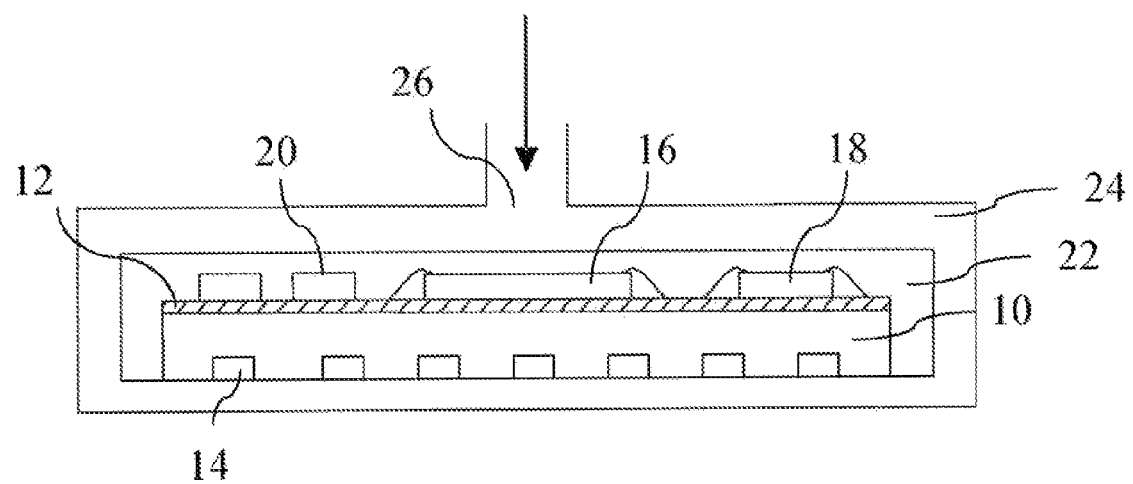
FIG. 1A is a diagram showing the packaging manner of a prior art molded structure of a memory card.
Figure 1B:
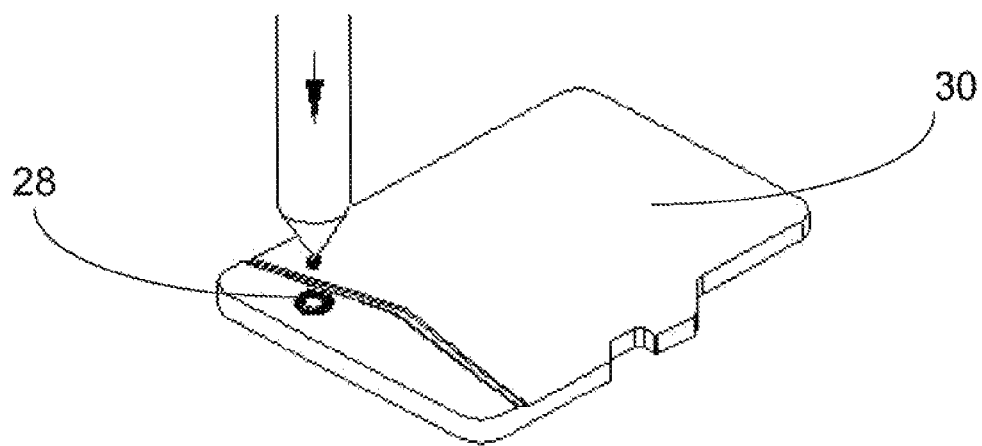
FIG. 1B is a perspective view of a prior art molded structure of a memory card with encapsulant inlet on top and molding in progress.
Figure 1C:
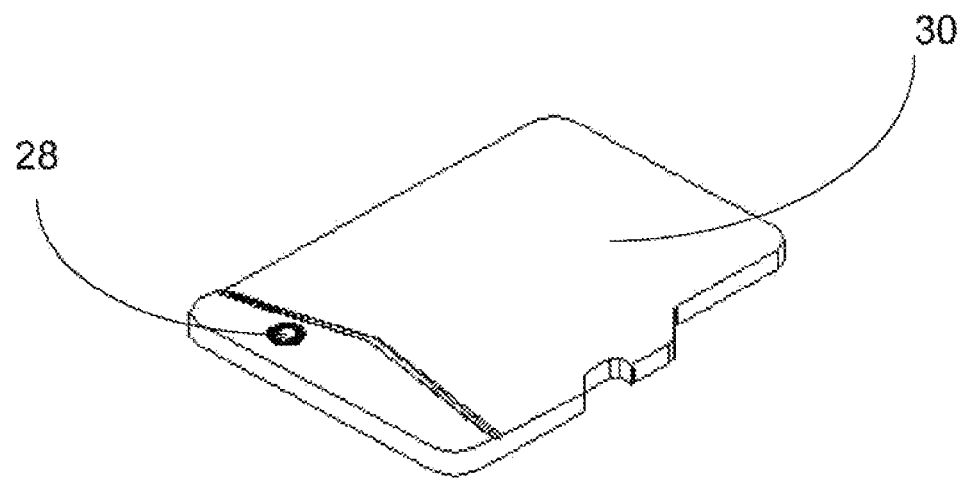
FIG. 1C is a perspective view of a prior art molded structure of a memory card with trace mark after molding.
Figure 2:
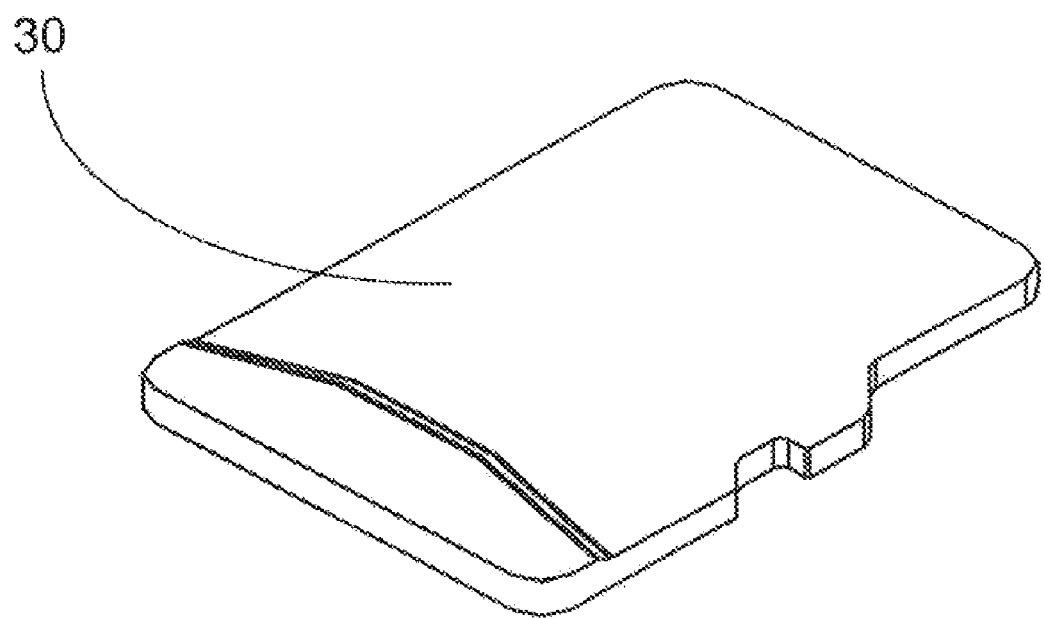
FIG. 2 is a perspective view of the molded structure of a memory card of the present invention.
Figure 3:
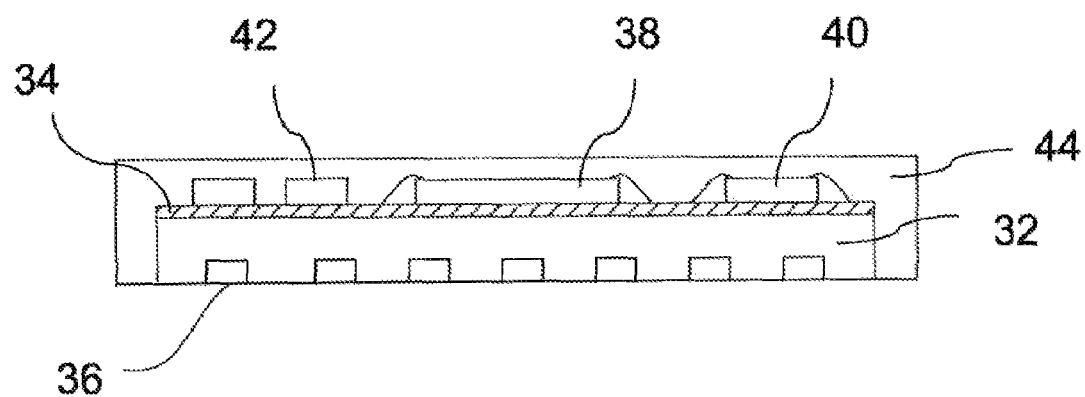
FIG. 3 is a cross-sectional view of the molded structure of a memory card of the present invention.

As shown in FIGS. 2 and 3, a molded structure of a memory card 30 includes a circuit substrate 32 having an upper surface and a lower surface. A circuit layer 34 and a plurality of electric contacts 36 are located on the upper and lower surfaces of the circuit substrate 32, respectively. The electric contacts 36 are electrically connected to the circuit layer 34 via a plurality of conducting lines (not shown) in the circuit substrate 32. The electric contacts 36 are also used for electric connection with the outside. A memory chip 38, a control chip 40, and several electronic components 42 selected among resistors, capacitors, inductors, and transformers are located on the upper surface of the circuit substrate 32 and electrically connected with the circuit layer 34. The memory chip 38 and the control chip 40 electrically connect the circuit layer 34 by wire bonding, flip chip or surface mount technology (SMT) (surface mount, now shown). An encapsulant covering 44 encapsulates all the above components with only the electric contacts 36 on the lower surface of the circuit substrate 32 exposed. As shown in FIG. 3, the outer surface of the encapsulant covering 44 is smooth and intact.

Figure 4A:
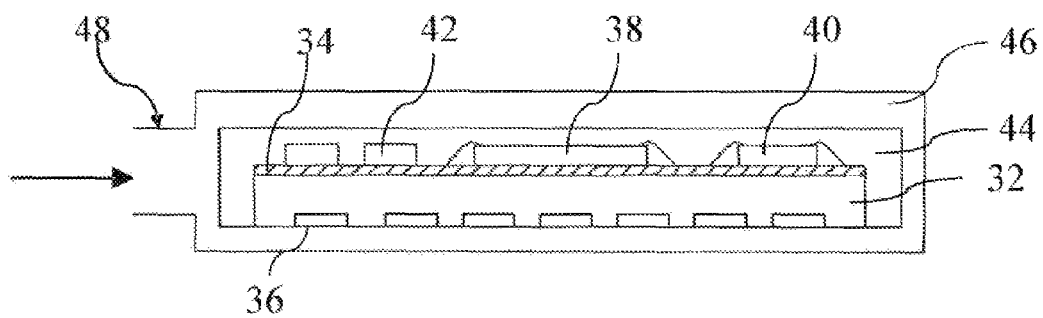
FIG. 4A is a diagram showing the encapsulating step according to an embodiment of the present invention.
Figure 4B:
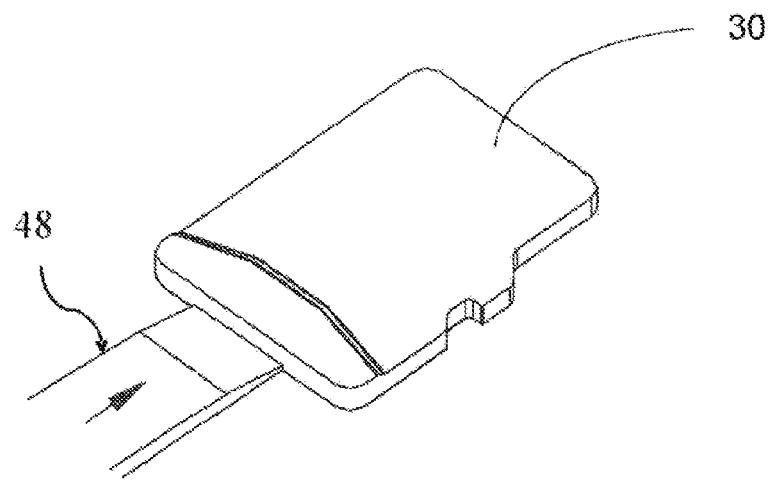
FIG. 4B is a diagram showing the encapsulating step according to another embodiment of the present invention.
Figure 4C:
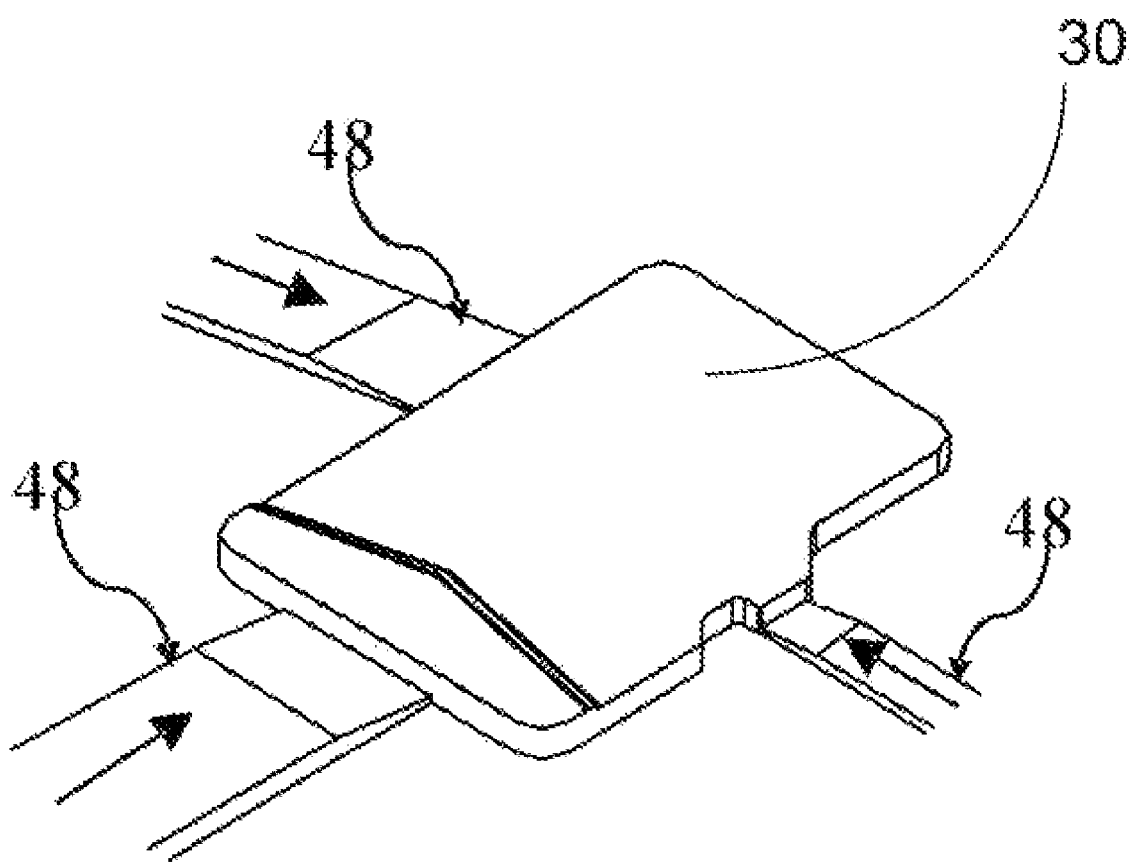
FIG. 4C is a diagram showing the encapsulating step according to yet another embodiment of the present invention.

The way of forming the encapsulant covering 44 is described below with reference to FIGS. 4A and 4B. First, the circuit substrate 32 is placed in a mold 46, which has an encapsulant inlet 48 on a side surface of the circuit substrate 32. Thermosetting encapsulant selected among phenolic resin, urea resin, melamine resin, and epoxy resin is injected in the encapsulant inlet 48. The thermosetting encapsulant hardens between the temperatures of 120° C. and 250° C. to form the encapsulant covering 44. Next, the finished product of a memory card is taken out from the mold 46, and the trace mark of the encapsulant inlet 48 remaining on the outer surface of the encapsulant covering 44 is then cut to produce the molded structure of memory card 30 with an smooth and intact outer appearance. Moreover, as shown in FIG. 4C, the mold 46 can also have several encapsulant inlets 48 arranged on different side surfaces of the circuit substrate 32 to disperse the thermosetting encapsulant.

The present invention is characterized in the design of the encapsulant inlet provided on the side surface of the mold, and makes use of a shaped mold pressing manner to form an encapsulant covering of a memory card. Every complex shape, corner or chamfer, be it two-dimensional or three-dimensional, of the memory card is constructed and formed by the mold. The encapsulant inlet 48 is introduced only at the straight-line side of the memory card for easier cut, or punch, later in the singulation process. It is only necessary to cut the trace mark of the encapsulant inlet remaining on the outer surface of the encapsulant covering to realize a molded structure of a memory card with an smooth and intact outer appearance.

Figure 5:
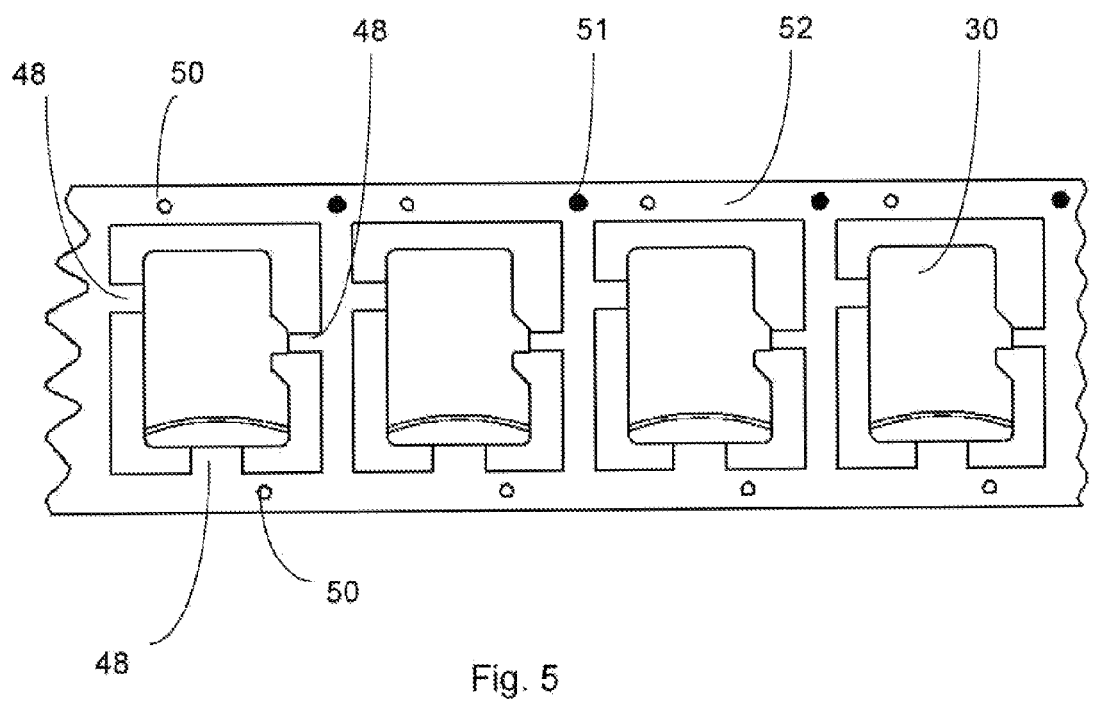
FIG. 5 is a diagram showing a substrate panel of multiple shape-molding structure in one manufacturing process.

The present invention can be clustered into a substrate panel 52 of multiple shape-molding structures in one manufacturing process, as shown in FIG. 5. The substrate panel 52 includes a plurality of molded memory cards 30, encapsulant inlets 48, fiducial marks 50, and fixture holes 51. The encapsulant inlets 48 also serves as a connection bar for the substrate panel 52 to hold the molded memory cards 30 during molding process. The encapsulant inlets 48 will later be cut, punched or singulated to detach the molded memory cards 30 from the substrate panel 52 without leaving any noticeable trace mark 28. The fiducial marks 50 are for component mounting or wire bonding alignment purposes before commencement of the molding process. The fixture holes 51 are for molding and detachment of memory cards 30 on the substrate panel 52, during and after the molding process.

The present invention applies not only to any existent memory cards such as Multi Media cards (MMC cards), Smart Media cards (SM cards), Secure Digital cards (SD cards), Compact Flash cards (CF cards), Memory Stick cards (MS cards), but also provides an efficient method and system for forming the encapsulant covering for miniaturized memory cards such as microSD cards and MMC Micro cards or future memory cards with even smaller sizes.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a molded memory card comprising:

providing a circuit in a mold, wherein the circuit further comprises a substrate panel with fiducial marks for component mounting or wire bonding alignment purposes before the circuit is encapsulated;

injecting encapsulant in at least one encapsulant inlet on the mold on at least one side surface of the circuit to provide an encapsulant covering on the circuit, wherein the encapsulant inlet serves as a connection bar for the substrate panel inlet to also hold the memory card;

removing the circuit from the mold; and removing a trace mark of the at least one encapsulant inlet remaining on the encapsulated covering.

2. The method of claim 1 wherein the circuit comprises a circuit substrate having an upper surface and a lower surface;

a circuit layer and a plurality of electric contacts being located on said upper and lower surfaces, respectively, said electric contacts being electrically connected with said circuit layer and used for electric connection with the outside; and at least one chip located on said upper surface of said circuit substrate and electrically connected to said circuit layer.

3. The method as claimed in claim 1 wherein the encapsulant covering is made of a thermosetting encapsulant.

4. The method as claimed in claim 2 wherein the thermosetting encapsulant is selected among phenolic resin, urea resin, melamine resin, and epoxy resin.

5. The method as claimed in claim 2 wherein the thermosetting encapsulant hardens under a temperature between 120° C. and 250° C.

6. The method as claimed in claim 2 wherein the chip and the circuit layer make use of wire bonding, flip chip or surface mount technology (SMT) to achieve electric connection.

7. The method as claimed in claim 2 wherein the chip is a memory chip.

8. The method as claimed in claim 2 further comprising a control chip and a plurality of electronic components, wherein the control chip and electronic components are located on the upper surface of the circuit substrate and electrically connected with the circuit layer.

9. The method as claimed in claim 8 wherein the electronic components are selected among resistors, capacitors, inductors, and transformers.

10. The method as claimed in claim 8 wherein the control chip and the circuit layer make use of wire bonding, flip chip or SMT to achieve electric connection.

11. The method as claimed in claim 2 wherein a plurality of conducting lines is disposed in the circuit substrate to electrically connect the circuit layer to the electric contacts.

12. The method as claimed in claim 1 further comprising forming a complex shape, corner or chamfer of the memory card that is constructed from the mold.

13. The method as claimed in claim 1 further comprising a plurality of encapsulant inlets; introduced only at the straight-line side of the memory card for easier cut, or punch, later in the removing step.

14. The method as claimed in claim 1 wherein the circuit further comprises a substrate panel of multiple shape-molding structure in one manufacturing process.

15. The method as claimed in claim 1 wherein the circuit further comprises a substrate panel with fixture holes for molding and detachment of memory cards, during and after the circuit is encapsulated.

16. A molded memory card comprising:

a circuit substrate having an upper surface and a lower surface, wherein the circuit substrate further comprises a substrate panel with fiducial marks for component mounting or wire bonding alignment purposes before the circuit is encapsulated;

a circuit layer and a plurality of electric contacts being located on the upper and lower surfaces, respectively, the electric contacts being electrically connected with the circuit layer and used for electric connection with the outside;

at least one chip located on the upper surface of the circuit substrate and electrically connected to the circuit layer; and an encapsulant covering for encapsulating all the above components with only the electric contacts exposed; wherein a trace mark is not visible on the molded card.

17. The molded memory card of claim 16 wherein the encapsulant covering is made of a thermosetting encapsulant.

18. The molded memory card of claim 16 wherein the thermosetting encapsulant is selected among phenolic resin, urea resin, melamine resin, and epoxy resin.

19. The molded memory card of claim 16 wherein the chip is a memory chip.

20. The molded memory card of claim 16 further comprising a control chip and a plurality of electronic components, wherein the control chip and electronic components are located on the upper surface of the circuit substrate and electrically connected with the circuit layer.

21. The molded memory card of claim 16 wherein a plurality of conducting lines is disposed in the circuit substrate to electrically connect the circuit layer to the electric contacts.

22. A method for providing a plurality of molded memory card:

the method comprising;

providing a plurality of circuits in a mold, wherein each of the plurality of the circuits further comprises a substrate panel with fiducial marks for component mounting or wire bonding alignment purposes before the circuit is encapsulated;

the mold including a plurality encapsulated inlets on side surfaces of each of the plurality of the circuits; and injecting encapsulant in each of the encapsulant inlets to provide an encapsulant covering for each of the circuits, wherein each of the encapsulate inlets serve as a connection bar for the substrate panel inlet to also hold the memory card.

23. The method of claim 22 further comprising;

removing the circuits from the mold, wherein each encapsulant covering includes a plurality of trace marks; and removing the plurality of trace marks on each encapsulant covering.

* * * * *